United States Patent
Grimaldi et al.

(10) Patent No.: US 12,149,252 B2
(45) Date of Patent: Nov. 19, 2024

(54) DELTA-SIGMA MODULATOR WITH MODIFIED QUANTIZATION ERROR SHAPING

(71) Applicant: Infineon Technologies AG, Neubiberg (DE)

(72) Inventors: Luigi Grimaldi, Villach (AT); Dmytro Cherniak, Villach (AT); Fabio Padovan, Villach (AT); Giovanni Boi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 163 days.

(21) Appl. No.: 18/064,823

(22) Filed: Dec. 12, 2022

(65) Prior Publication Data

US 2024/0195420 A1   Jun. 13, 2024

(51) Int. Cl.
*H03L 7/081* (2006.01)
*H03L 7/107* (2006.01)
*H03L 7/23* (2006.01)

(52) U.S. Cl.
CPC ............ *H03L 7/0818* (2013.01); *H03L 7/107* (2013.01); *H03L 7/235* (2013.01)

(58) Field of Classification Search
CPC ............ H03M 3/00; H03M 3/30; H03M 3/32; H03M 3/322; H03M 3/324; H03M 3/326; H03M 3/328; H03M 3/3283; H03M 3/3287; H03M 3/33; H03M 3/332; H03M 3/364; H03M 3/362; H03M 3/36; H03M 3/358

See application file for complete search history.

(56) References Cited

U.S. PATENT DOCUMENTS

| | | | | |
|---|---|---|---|---|
| 5,870,048 A | * | 2/1999 | Kuo ...................... | H03M 3/474 341/143 |
| 8,089,382 B2 | * | 1/2012 | Pagnanelli ............ | H03M 3/468 341/120 |
| 9,178,529 B2 | * | 11/2015 | Dong .................... | H03M 3/344 |

* cited by examiner

*Primary Examiner* — Diana J. Cheng
(74) *Attorney, Agent, or Firm* — Harrity & Harrity, LLP

(57) ABSTRACT

A digital phase-locked loop (DPLL) may include a delta-sigma modulator (DSM). The DSM may include a delay component configured to perform noise shaping of a quantization error introduced by the DSM. The DSM may include a noise transfer function (NTF) component configured to perform filtering of the quantization error introduced by the DSM. The DSM may include an adjustment transfer function (ATF) component configured to cause the filtering of the quantization error to be applied on top of the noise shaping such that an impact of the NTF component on the noise shaping is reduced.

20 Claims, 8 Drawing Sheets

DELTA-SIGMA MODULATOR WITH MODIFIED QUANTIZATION ERROR SHAPING

BACKGROUND

A phase-locked loop (PLL) is a device that generates a clock and synchronizes the clock with a reference signal. One application of a PLL is frequency synthesis. In a frequency synthesis application, a PLL can be used to generate a clock based on a reference clock (e.g., a reference signal provided by a reference oscillator). Notably, a frequency of the clock generated by the PLL can be a multiple of a frequency the original clock. A digital PLL (DPLL) is a type of PLL that can be used to synchronize digital signals. Components of a DPLL can include a phase detector (e.g., a time-to-digital convertor (TDC)), a digital loop filter (DLF), a delta sigma modulator (DSM), an oscillator, and a divider. Notably, in the case of an all-digital PLL (ADPLL), the oscillator is a digitally-controlled oscillator (DCO) (rather than a voltage-controlled oscillator (VCO) as used in a conventional DPLL). In operation of a DPLL, the phase detector senses a phase difference between a reference signal and a feedback signal, with the feedback signal being generated by dividing an output signal of DCO. The phase detector converts the phase difference to a phase error signal in the digital domain, and the phase error signal is filtered by the DLF and is then used in association with controlling the DCO.

SUMMARY

In some implementations, a DPLL includes a delta-sigma modulator (DSM), including: a delay component configured to perform noise shaping of a quantization error introduced by the DSM: a noise transfer function (NTF) component configured to perform filtering of the quantization error introduced by the DSM: and an adjustment transfer function (ATF) component configured to cause the filtering of the quantization error to be applied on top of the noise shaping such that an impact of the NTF component on the noise shaping is reduced.

In some implementations, a DSM includes a delay component configured to perform noise shaping of a quantization error in an output signal of the DSM: an NTF component configured to performing filtering of the quantization error; and an ATF component configured to cause the filtering of the quantization error to be applied without impairing the noise shaping.

In some implementations, a method includes performing, by a delay component of a DSM, noise shaping of a quantization error introduced by the DSM: performing, by an NTF component of the DSM, filtering of the quantization error introduced by the DSM: and causing, by an ATF component of the DSM, the filtering of the quantization error by the NTF component to be applied in addition to the noise shaping performed by the delay component and without impairing the noise shaping.

DETAILED DESCRIPTION

The following detailed description of example implementations refers to the accompanying drawings. The same reference numbers in different drawings may identify the same or similar elements.

A DPLL (e.g., an ADPLL) may need to achieve a stringent desire in terms of spot phase noise (also referred to as emission mask) in a given application. For example, a DPLL used in a communication application or in a radar application may need to achieve a stringent desire in terms of spot phase noise.

Figure 1A:
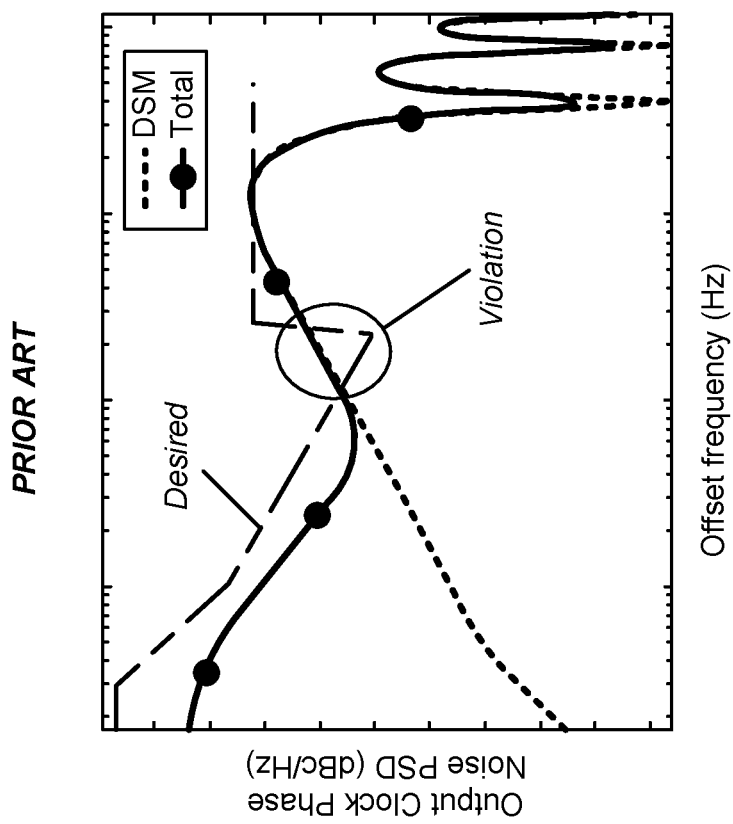
FIGS. 1A and 1B are diagrams associated with a conventional DSM.

Conventionally, a DPLL includes a delta-sigma modulator (DSM) (between a digital loop filter (DLF) and a DCO) to increase an equivalent frequency resolution of the DPLL. Notably, while the DSM increases the frequency resolution, the DSM also introduces quantization error. The DSM can be configured to perform high-pass shaping of the quantization error. However, in some scenarios, the contribution of the quantization error introduced by the DSM to phase noise in the output signal of the DPLL can cause a desired emission mask to be violated, an example of which is illustrated in FIG. 1A. In the example shown in FIG. 1A, the contribution of the quantization error introduced by the DSM to the total phase noise causes a desired emission mask to be violated in an offset frequency range between, for example, approximately 10 megahertz (MHz) and approximately 30 MHz.

Figure 1B:
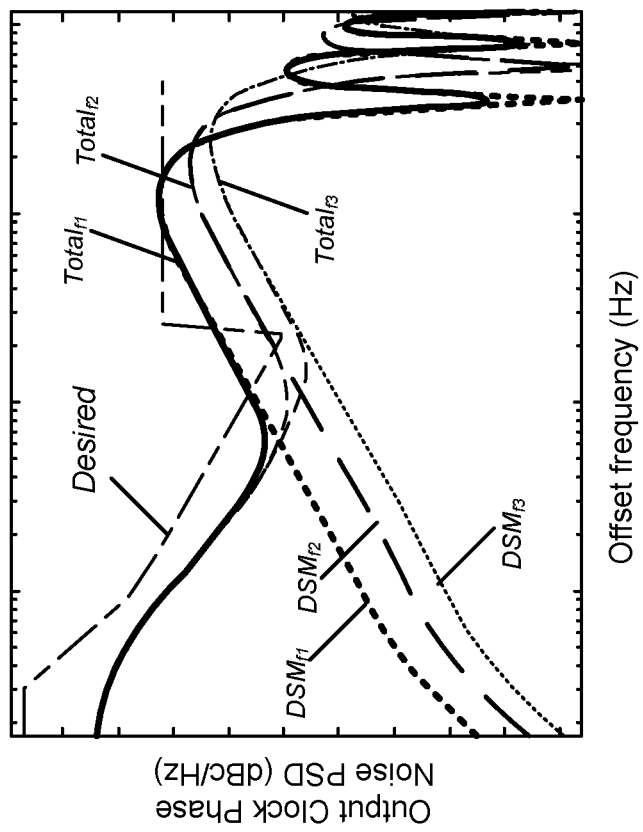

One technique to address the quantization error introduced by the DSM is to increase the clock frequency of the DSM (i.e., clock the DSM with a higher sampling rate) as compared to an update rate of the DPLL loop (e.g., which is typically that of a reference signal). By increasing the clock frequency of the DSM, it is possible to push phase noise caused by the quantization error toward higher offset frequencies and reduce a peak of the phase noise to a point at which the desired emission mask is achieved (i.e., no longer violated), an example of which is illustrated in FIG. 1B. In the example shown in FIG. 1B, when the clock frequency of the achieved is increased to a frequency f3 (e.g., as compared to a frequency f1 that is less than a frequency f2, which is less than the frequency f3), the phase noise caused by the quantization error is pushed toward higher offset frequencies and reduces a peak of the phase noise such that the desired emission mask is achieved. However, this technique comes with the disadvantage of increased power consumption. For example, doubling the clock frequency also results in a doubling of power consumption.

Some implementations described herein provide techniques and apparatuses for a DSM with modified quantization error shaping. In some aspects, the DSM includes a delay component configured to perform noise shaping of a quantization error introduced by the DSM, a noise transfer function (NTF) component configured to perform filtering of the quantization error introduced by the DSM, and an adjustment transfer function (ATF) component configured to cause the filtering of the quantization error to be applied on top of the noise shaping such that an impact of the NTF component on the noise shaping is reduced. In some implementations, the DSM described herein prevents a violation of a desired emission mask due to quantization error of the DSM without a need to increase the clock frequency of the DSM, thereby improving performance without a need to increase power consumption. Additional details are provided below.

Figure 2A:
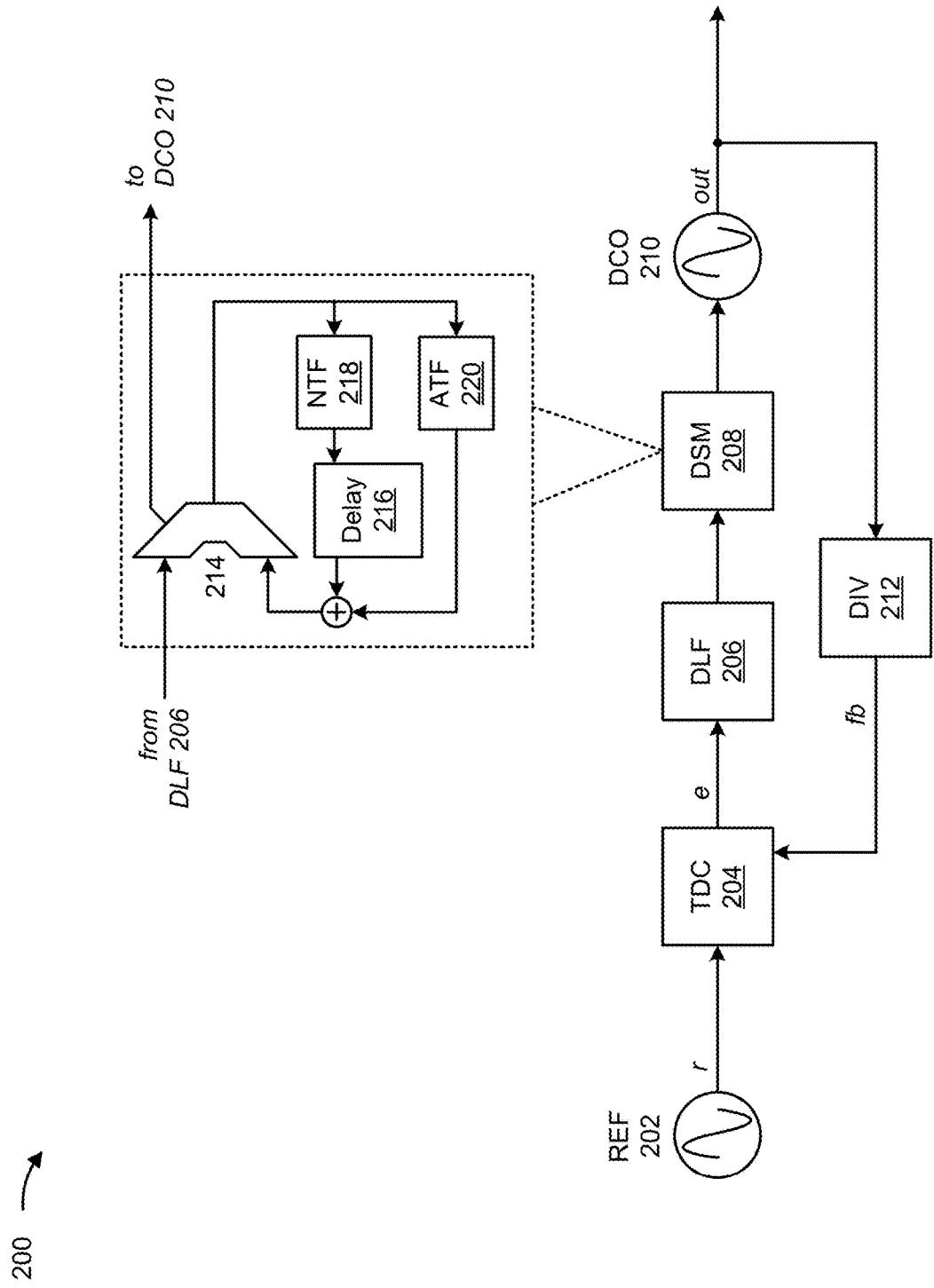
FIGS. 2A-2C are diagrams illustrating example implementations of a DSM that provides modified quantization error shaping, as described herein.
Figure 2B:
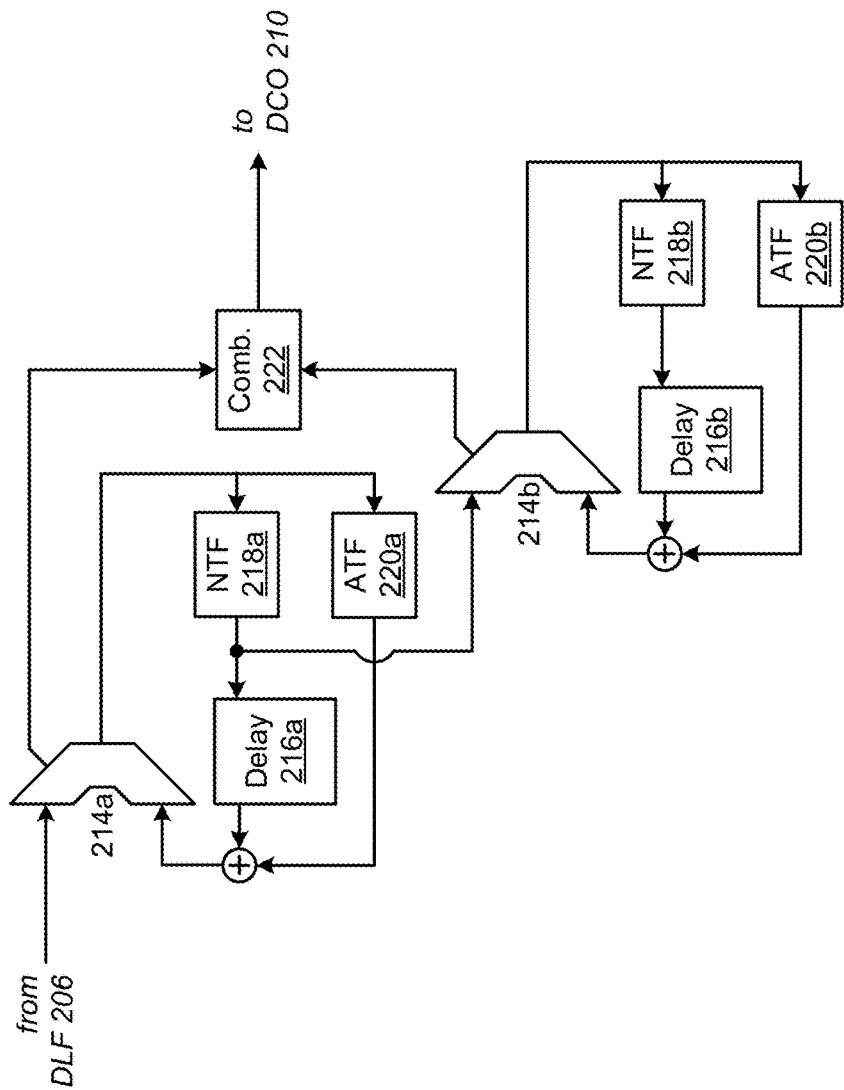
Figure 2C:
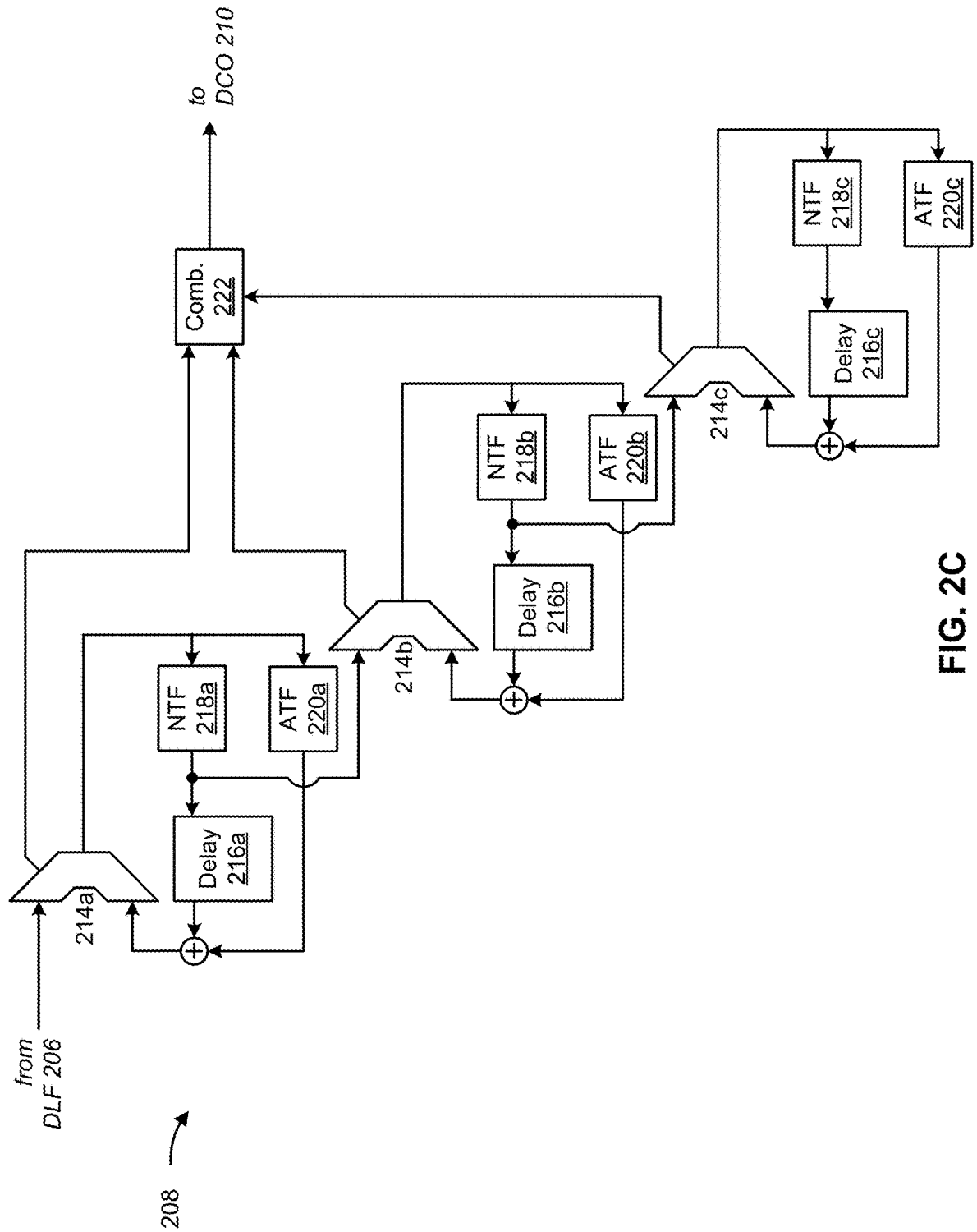

FIGS. 2A-2C are diagrams illustrating example implementations of a DPLL 200 including a DSM that provides modified quantization error shaping, as described herein. As shown in FIG. 2A, the DPLL 200 may include a reference oscillator (REF) 202, a TDC 204, a DLF 206, a DSM 208, a DCO 210, and a frequency divider (DIV) 212.

The REF 202 is a component configured to provide a reference signal. That is, the REF 202 is component that provides a reference signal based on which an output signal (identified as out in FIG. 2A) of the DPLL 200 is to be generated and with which the output signal is to be synchronized. The reference signal is identified as r in FIG. 2A.

The TDC 204 is a component configured to provide a phase error signal that indicates a phase difference between the reference signal and a feedback signal. That is, the TDC 204 may detect a phase difference between the reference signal and the feedback signal generated by the DPLL 200. The phase error signal and the feedback signal are identified as e and fb, respectively, in FIG. 2A. As shown, in some implementations, the feedback signal is an output of the DIV 212. Thus, in some implementations, the feedback signal is the frequency-divided output signal output by the DIV 212.

The DLF 206 is a component configured to control the DSM 208 or the DCO 210 based on the phase error signal provided by the TDC 204. That is, the DLF 206 may be configured to receive the phase error signal and adjust control of the DSM 208 or the DCO 210 based on the phase error signal (e.g., in order to improve synchronization between the reference signal and the output signal of the DPLL 200).

The DSM 208 is a component configured to increase an equivalent frequency resolution of the DPLL 200. In some implementations, as illustrated in FIG. 2A, the DSM 208 may include an accumulator 214, a delay component 216, a noise transfer function (NTF) component 218, and an adjustment transfer function (ATF) component 220.

The accumulator 214 is a component configured to increase the frequency resolution of the DPLL 200. The delay component 216 is a component configured to perform noise shaping of a quantization error introduced by the DSM 208 (e.g., by the accumulator 214) in association with increasing the frequency resolution of the DPLL 200.

The NTF component 218 is a component configured to perform filtering of the quantization error introduced by the DSM 208. That is, the NTF component 218 is a component configured to filter the quantization error from an output of the DSM 208 such that phase noise in the output signal of the DPLL 200 attributable to the quantization error of the DSM 208 is reduced. In some implementations, the NTF component 218 may be configured to perform notch filtering, low pass filtering, high pass filtering, or another filtering provided by another type of transfer function.

The ATF component 220 is configured to cause the filtering of the quantization error to be applied on top of the noise shaping such that an impact of the NTF component on the noise shaping is reduced. That is, the ATF component 220 is a component configured to cause only the quantization error (and not the input signal of the DSM 208) to experience the filtering of the NTF component 218. In this way, the ATF component 220 enables the filtering by the NTF component 218 to be provided on top of (i.e., in addition to, but without impacting) the noise shaping that is provided by the delay component 216.

In some implementations, as illustrated in FIG. 2A, the DSM 208 has a modified multi-stage noise shaping (MASH) architecture. For example, a DSM with a conventional MASH architecture includes an accumulator and a delay component on a feedback path. However, as shown in FIG. 2A, the modified MASH architecture comprises the accumulator 214, the delay component 216, the NTF component 218, and the ATF component 220, with the delay component 216 and the NTF component 218 being on a first branch of a feedback path and the ATF component 220 being on a second branch of the feedback path (e.g., a branch in parallel with the first branch). In some implementations, the DSM 208 may have another type of architecture, such as a modified nest loop architecture (e.g., a nest loop similarly modified to include the NTF component 218 and the ATF component 220), or another type of architecture.

In some implementations, as in the DPLL 200 shown in FIG. 2A, the DSM 208 is configured to provide first order noise shaping. Alternatively, the DSM 208 may be configured to provide higher order (e.g., second order, third order, or the like) noise shaping.

FIG. 2B is a diagram illustrating a DSM 208 configured to provide second order noise shaping. As shown in FIG. 2B, the DSM 208 that provides second order noise shaping may include a delay component 216a, an NTF component 218a, and an ATF component 220a, a delay component 216b, an NTF component 218b, an ATF component 220b, and a combiner 222. Here, the delay component 216b enables second order noise shaping (e.g., in conjunction with the delay component 216a), the NTF component 218b performs filtering of the quantization error (e.g., in conjunction with the NTF component 218a), and the ATF component 220b reduces the impact of the second NTF component 218b on the second order noise shaping (e.g., in conjunction with the ATF component 220a).

FIG. 2C is a diagram illustrating a DSM 208 configured to provide third order noise shaping. As shown in FIG. 2C, the DSM 208 that provides second order noise shaping may include a delay component 216a, an NTF component 218a, and an ATF component 220a, a delay component 216b, an NTF component 218b, an ATF component 220b, a delay component 216c, an NTF component 218c, an ATF component 220c, and a combiner 222. Here, the delay component 216c enables third order noise shaping (e.g., in conjunction with the delay components 216a and 216b), the NTF component 218c performs filtering of the quantization error (e.g., in conjunction with the NTF components 218a and 218b), and the ATF component 220c reduces the impact of the third NTF component 218c on the third order noise shaping (e.g., in conjunction with the ATF components 220a and 220b). The cascading architecture shown in FIGS. 2B and 2C can be further extended to provide higher order noise shaping.

In some implementations, a clock frequency of the DSM 208 may be equal to a clock frequency of the DLF 206. That is, in some implementations, the clock frequency of the DSM 208 may match that of the DLF 206. Alternatively, the clock frequency of the DSM 208 may in some implementations be higher than the clock frequency of the DLF 206. In some implementations, the use of the higher clock frequency for the DSM 208 may cause push phase noise caused by the quantization error to be pushed toward higher offset frequencies and a reduction in a phase noise peak, as described above. In some implementations, the comparatively higher clock frequency for the DSM 208 may be used in combination with one or more NTF components 218 and one or more corresponding ATF components 220 to ensure that a desired emission mask is achieved (e.g., with a smaller increase in power consumption as compared to use of the higher clock frequency alone).

The DCO 210 is a component configured to generate the output signal of the DPLL 200. In some implementations, a frequency or other characteristic of the output signal generated by the DCO 210 is controlled by the DLF 206, as described above. In some implementations, as shown in FIG. 2A, the DCO 210 may be configured to provide the output signal to the DIV 212 (in addition to providing the output signal as an output of the DPLL 200).

The DIV 212 is a component configured to perform frequency division on the output signal of the DPLL 100 to generate the frequency-divided output signal. In some implementations, the frequency-divided output signal is a signal that has a frequency that matches the frequency of the reference signal and a phase that matches the phase of the output signal. In some implementations, the DIV 212 provides the feedback signal to the TDC 204.

In an example operation of the DPLL 200 shown in FIG. 2A, the REF 202 provides a reference signal to the TDC 204. The TDC 204 receives the reference signal from the REF 202, receives a feedback signal from the DIV 212, and the TDC 204 provides a phase error signal based on the reference signal and the feedback signal. Here, the phase error signal indicates a phase difference between the reference signal and the feedback signal. The DLF 206 receives the phase error signal and controls the DSM 208 and the DCO 210 based on the phase error signal (e.g., so as improve synchronization between the reference signal and the output signal). The DSM 208 increases the frequency resolution of the signal while providing noise shaping and filtering, as described above, and the DCO 210 generates the output signal of the DPLL 200. The output signal is also provided to the DIV 212. The DIV 212 receives the output signal and performs frequency division on the output signal to generate a frequency-divided output signal as the feedback signal.

As indicated above, FIGS. 2A-2C are provided as examples. Other examples may differ from what is described with regard to FIGS. 2A-2C. The number and arrangement of components shown in FIGS. 2A-2C are provided as an example. In practice, there may be additional components, fewer components, different components, or differently arranged components than those shown in FIGS. 2A-2C. Furthermore, two or more components shown in FIGS. 2A-2C may be implemented within a single component, or a single component shown in FIGS. 2A-2C may be implemented as multiple, distributed components. Additionally, or alternatively, a set of components (e.g., one or more components) shown in FIGS. 2A-2C may perform one or more functions described as being performed by another set of components shown in FIGS. 2A-2C.

Figure 3A:
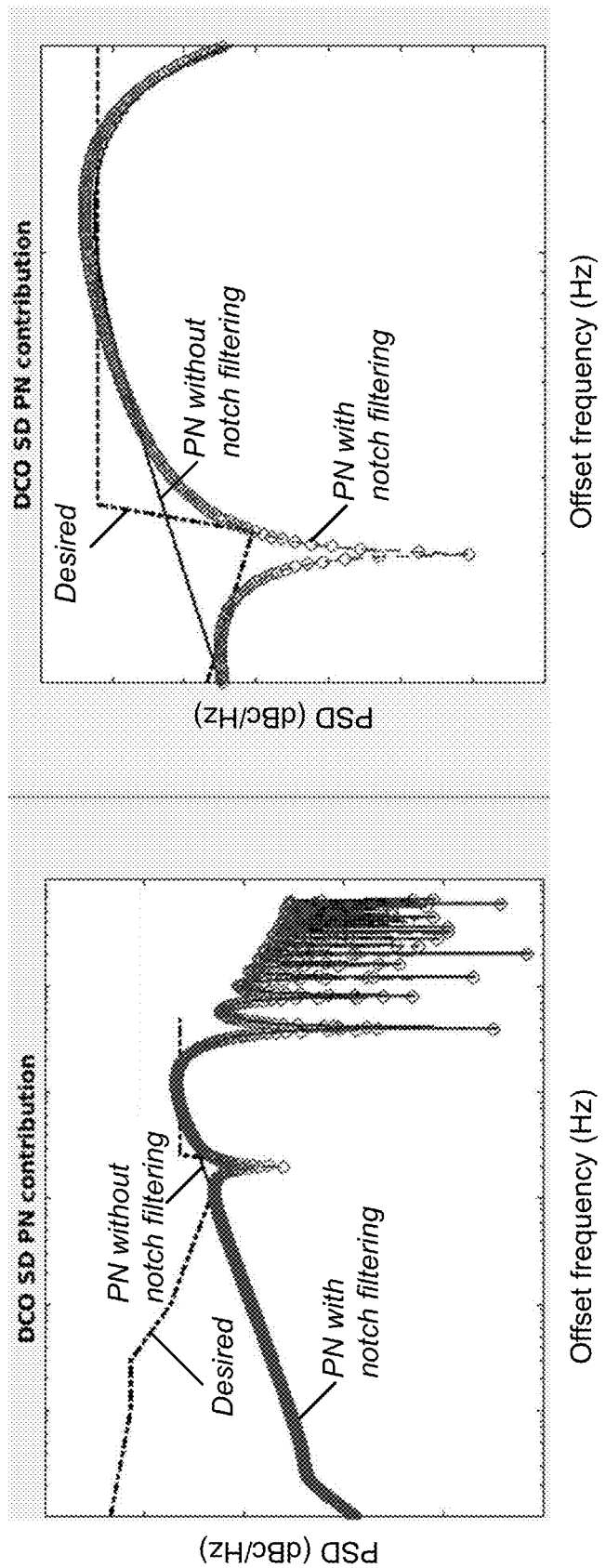
FIGS. 3A and 3B are diagram illustrating examples of phase noise filtering provided by a DSM that provides modified quantization error shaping, as described herein.
Figure 3B:
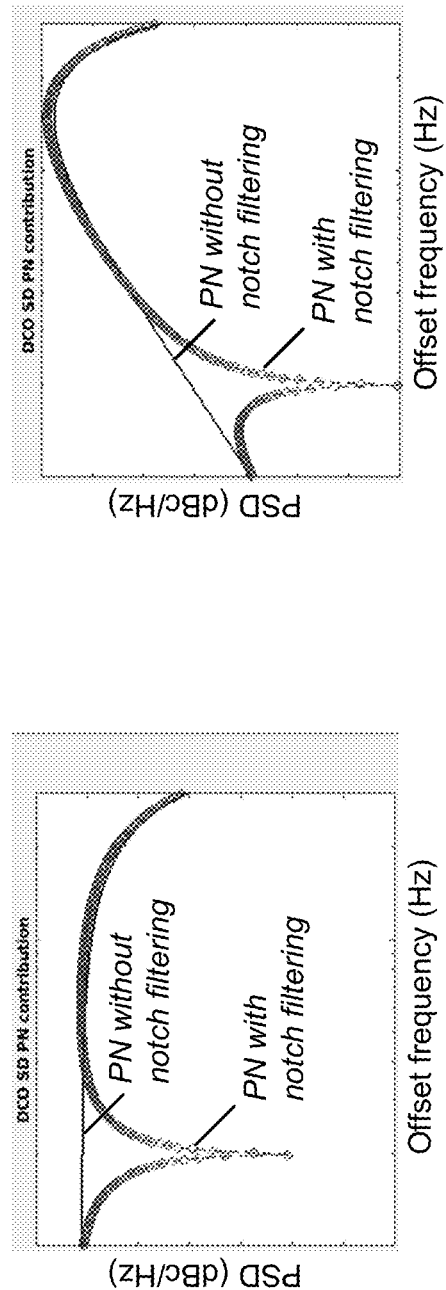

FIGS. 3A and 3B are diagram illustrating examples of noise filtering provided by a DSM 208 that provides modified quantization error shaping.

FIG. 3A illustrates an example in which a DSM 208 provides second order noise shaping and a set of NTF components 218 and a corresponding set of ATF components 220 perform notch filtering such that the notch filtering does not impact the second order noise shaping. As shown in FIG. 3A, when notch filtering is provided by the DSM 208 (as indicated by the line labeled "PN with notch filtering"), the resulting phase noise is such that the desired emission mask is achieved in the offset frequency range between approximately 10 MHz and approximately 30 MHz. Conversely, when notch filtering is not provided (e.g., as in a conventional DSM, as indicated by the line labeled "PN without notch filtering") the phase noise causes the desired emission mask to be violated in the offset frequency range between approximately 10 MHz and approximately 30 MHz. Therefore, as illustrated in FIG. 3A, the DSM 208 is capable of introducing a notch transfer function only on the quantization error of the DSM 208, thus making it possible to achieve the desired emission mask. Further, the DSM 208 can enable the desired emission mask to be achieved without an increase of the clock frequency of the DSM 208, thereby conserving power. FIG. 3B illustrates examples in which a DSM 208 provides first order noise shaping (left diagram) or third order noise shaping (right diagram) in a similar manner as illustrated with respect to second order noise shaping as shown in in FIG. 3A.

As indicated above, FIGS. 3A and 3B are provided as examples. Other examples may differ from what is described with regard to FIGS. 3A and 3B.

Figure 4:
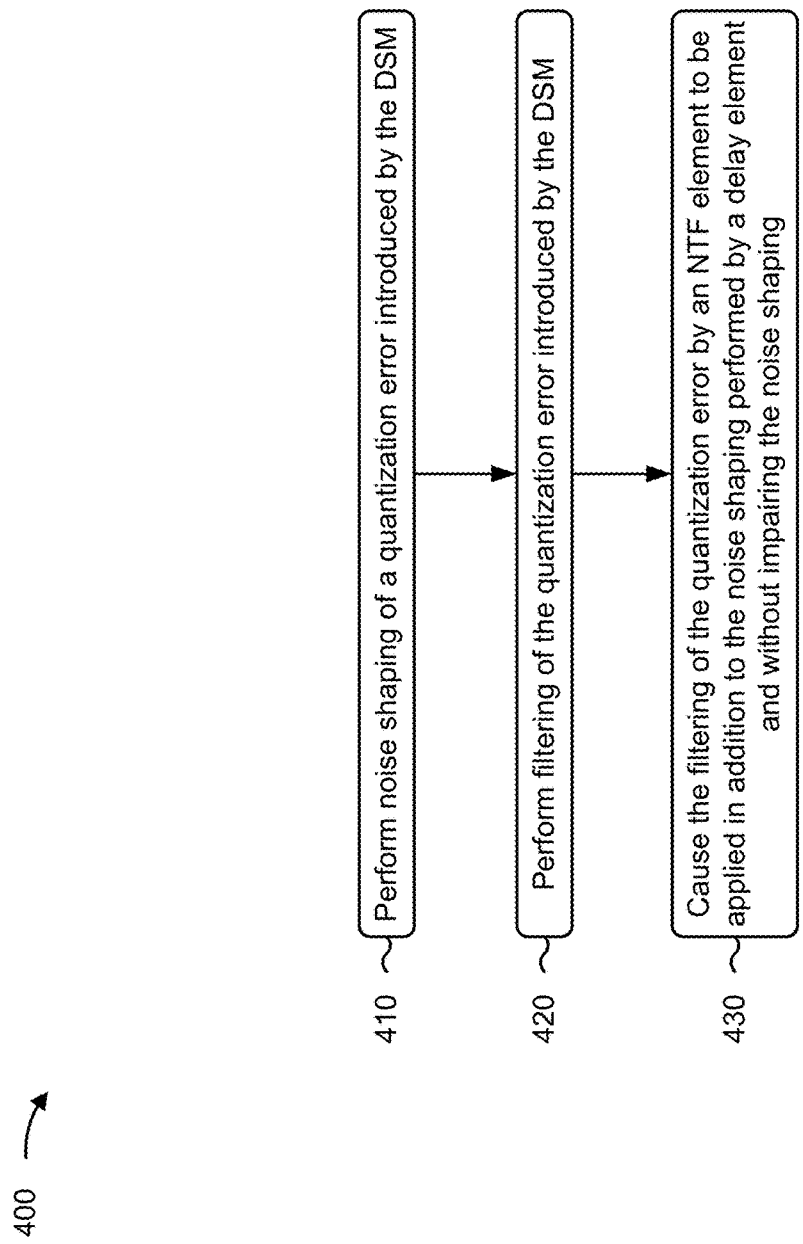
FIG. 4 is a flowchart of an example process performed by a DSM that provides modified quantization error shaping, as described herein.

FIG. 4 is a flowchart of an example process 400 performed by a DSM that provides modified quantization error shaping. In some implementations, one or more process blocks of FIG. 4 are performed by a DSM of a DPLL (e.g., a DSM 208 of a DPLL 200). Additionally, or alternatively, one or more process blocks of FIG. 4 may be performed using one or more components of a DSM, such as using an accumulator (e.g., an accumulator 214), a delay component (e.g., a delay component 216), an NTF component (e.g., an NTF component 218), and/or an ATF component (e.g., an ATF component 220).

As shown in FIG. 4, process 400 may include performing noise shaping of a quantization error introduced by the DSM (block 410). For example, the DSM 208 (e.g., using the delay component 216) may perform noise shaping of a quantization error introduced by the DSM 208 (e.g., by the accumulator 214), as described above.

As further shown in FIG. 4, process 400 may include performing filtering of the quantization error introduced by the DSM (block 420). For example, the DSM 208 (e.g., using the NTF component 218) may perform filtering of the quantization error introduced by the DSM 208, as described above.

As further shown in FIG. 4, process 400 may include causing the filtering of the quantization error by the NTF component to be applied in addition to the noise shaping performed by the delay component and without impairing the noise shaping (block 430). For example, the DSM 208 (e.g., the ATF component 220) may cause the filtering of the quantization error by the NTF component 218 to be applied in addition to the noise shaping performed by the delay component 216 and without impairing the noise shaping, as described above.

Process 400 may include additional implementations, such as any single implementation or any combination of implementations described below and/or in connection with one or more other processes described elsewhere herein.

In a first implementation, the filtering is notch filtering, low pass filtering, or high pass filtering.

In a second implementation, alone or in combination with the first implementation, the DSM has a modified MASH architecture or a modified nest loop architecture.

In a third implementation, alone or in combination with one or more of the first and second implementations, the noise shaping is first order noise shaping.

In a fourth implementation, alone or in combination with one or more of the first through third implementations, the noise shaping is higher order noise shaping, and process 400 includes performing, using one or more additional delay components 216, the higher order noise shaping in conjunction with the delay component 216; performing, using one or more additional NTF components 218, the filtering of the quantization error in conjunction with the NTF component 218: and reducing, using one or more additional ATF components 220, an impact of the one or more additional NTF components 218 on the higher order noise shaping in conjunction with the ATF component 220.

In a fifth implementation, alone or in combination with one or more of the first through fourth implementations, a clock frequency of the DSM 208 is equal to or higher than a clock frequency of a DLF 206 of the DPLL 200.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A digital phase-locked loop (DPLL), comprising:
    a delta-sigma modulator (DSM), including:
        a delay component configured to perform noise shaping of a quantization error introduced by the DSM;
        a noise transfer function (NTF) component configured to perform filtering of the quantization error introduced by the DSM; and
        an adjustment transfer function (ATF) component configured to cause the filtering of the quantization error to be applied on top of the noise shaping such that an impact of the NTF component on the noise shaping is reduced.

2. The DPLL of claim 1, wherein the NTF component is configured to perform notch filtering, low pass filtering, or high pass filtering.

3. The DPLL of claim 1, wherein the DSM has a modified multi-stage noise shaping (MASH) architecture or a modified nest loop architecture.

4. The DPLL of claim 1, wherein the noise shaping is first order noise shaping.

5. The DPLL of claim 1, wherein the noise shaping is second order noise shaping, the delay component is a first delay component, the NTF component is a first NTF component, and the ATF component is a first ATF component, and the DSM further includes:
    a second delay component associated with providing the second order noise shaping;
    a second NTF component associated with performing the filtering of the quantization error; and
    a second ATF component associated with reducing an impact of the second NTF component on the second order noise shaping.

6. The DPLL of claim 1, wherein the noise shaping is third order noise shaping, the delay component is a first delay component, the NTF component is a first NTF component, and the ATF component is a first ATF component, and the DSM further includes:
    a second delay component and a third delay component associated with providing the third order noise shaping;
    a second NTF component and a third NTF component associated with performing the filtering of the quantization error; and a second ATF component and a third ATF component associated with reducing an impact of the second NTF component and the third NTF component, respectively, on the third order noise shaping.

7. The DPLL of claim 1, wherein a clock frequency of the DSM is equal to or higher than a clock frequency of a digital loop filter (DLF) of the DPLL.

8. A delta-sigma modulator (DSM), comprising:
a delay component configured to perform noise shaping of a quantization error in an output signal of the DSM;
a noise transfer function (NTF) component configured to performing filtering of the quantization error; and
an adjustment transfer function (ATF) component configured to cause the filtering of the quantization error to be applied without impairing the noise shaping.

9. The DSM of claim 8, wherein the NTF component is configured to perform notch filtering, low pass filtering, or high pass filtering.

10. The DSM of claim 8, wherein the DSM has a modified multi-stage noise shaping (MASH) architecture or a modified nest loop architecture.

11. The DSM of claim 8, wherein the noise shaping is first order noise shaping.

12. The DSM of claim 8, wherein the noise shaping is second order noise shaping, the delay component is a first delay component, the NTF component is a first NTF component, and the ATF component is a first ATF component, and the DSM further includes:
a second delay component associated with providing the second order noise shaping;
a second NTF component associated with performing the filtering of the quantization error; and
a second ATF component associated with preventing the second NTF component from impacting the second order noise shaping.

13. The DSM of claim 8, wherein the noise shaping is third order noise shaping, the delay component is a first delay component, the NTF component is a first NTF component, and the ATF component is a first ATF component, and the DSM further includes:
a second delay component and a third delay component associated with providing the third order noise shaping;
a second NTF component and a third NTF component associated with performing the filtering of the quantization error; and
a second ATF component and a third ATF component associated with preventing the second NTF component and the third NTF component from impacting the third order noise shaping.

14. The DSM of claim 8, wherein the DSM is included in a digital phase-locked loop (DPLL).

15. The DSM of claim 14, wherein a clock frequency of the DSM is equal to or higher than a clock frequency of a digital loop filter (DLF) of the DPLL.

16. A method, comprising:
performing, by a delay component of a delta-sigma modulator (DSM), noise shaping of a quantization error introduced by the DSM;
performing, by a noise transfer function (NTF) component of the DSM, filtering of the quantization error introduced by the DSM; and
causing, by an adjustment transfer function (ATF) component of the DSM, the filtering of the quantization error by the NTF component to be applied in addition to the noise shaping performed by the delay component and without impairing the noise shaping.

17. The method of claim 16, wherein the filtering is notch filtering, low pass filtering, or high pass filtering.

18. The method of claim 16, wherein the DSM has a modified multi-stage noise shaping (MASH) architecture or a modified nest loop architecture.

19. The method of claim 16, wherein the noise shaping is first order noise shaping.

20. The method of claim 16, wherein the noise shaping is higher order noise shaping, and the method further comprises:
performing, by one or more additional delay components, the higher order noise shaping in conjunction with the delay component;
performing, by one or more additional NTF components, the filtering of the quantization error in conjunction with the NTF component; and
reducing, by one or more additional ATF components, an impact of the one or more additional NTF components on the higher order noise shaping in conjunction with the ATF component.

* * * * *